US006863773B1

(12) United States Patent
Emmerich et al.

(10) Patent No.: US 6,863,773 B1
(45) Date of Patent: Mar. 8, 2005

(54) LINEARLY EXTENDED DEVICE FOR LARGE-SURFACE MICROWAVE TREATMENT AND FOR LARGE SURFACE PLASMA PRODUCTION

(75) Inventors: Rudolf Emmerich, Durmersheim (DE); Mathias Kaiser, Karlsbad (DE); Urban Helfried, Bretten (DE); Peter Elsner, Pfinztal (DE); Klaus Martin Baumgärtner, Grumbach (DE); Eberhard Räuchle, Remseck (DE); Konstantin Räuchle, Remseck (DE)

(73) Assignee: Fraunhofer-Gesellschaft angewandten Forschung e.V. (DE)

( * ) Notice: Subject to any disclaimer, the term of this patent is extended or adjusted under 35 U.S.C. 154(b) by 442 days.

(21) Appl. No.: 09/979,928

(22) PCT Filed: May 30, 2000

(86) PCT No.: PCT/EP00/04899

§ 371 (c)(1), (2), (4) Date: Nov. 27, 2001

(87) PCT Pub. No.: WO00/75955

PCT Pub. Date: Dec. 14, 2000

(30) Foreign Application Priority Data

Jun. 4, 1999 (DE) ........................................ 199 25 493

(51) Int. Cl.[7] .......................... H05H 1/00; C23C 16/00; H01L 21/00

(52) U.S. Cl. .......................... 156/345.41; 118/723 MW

(58) Field of Search ....................... 156/345.41, 345.42, 156/345.36; 118/723 MW, 723 ME, 723 MA, 723 MR

(56) References Cited

U.S. PATENT DOCUMENTS 5,149,375 A * 9/1992 Matsuyama ................. 118/719
5,954,882 A * 9/1999 Wild et al. .......... 118/723 MW
6,109,208 A * 8/2000 Tsuchihashi et al. . 118/723 MA

FOREIGN PATENT DOCUMENTS

| | | | |
|---|---|---|---|
| DE | 37 12 971 | 11/1988 | |
| DE | 39 23 390 | 1/1990 | |
| DE | 40 37 091 | 5/1992 | |
| DE | 43 10 241 | 10/1993 | |
| DE | 195 07 077 | 4/1996 | |
| DE | 195 03 205 | 7/1996 | |
| DE | 19503205 C1 * | 7/1996 | ............ H05H/1/46 |

* cited by examiner

*Primary Examiner*—Parviz Hassanzadeh
(74) *Attorney, Agent, or Firm*—Paul Vincent

(57) ABSTRACT

The aim of the invention is to provide an alternative to the intensive treatment of a product, especially plasma treatment, in specific areas only. Towards this end, the invention provides a device for producing microwaves for treating workpieces, comprising at least one microwave antenna with an extended conductor for producing alternating electromagnetic fields, a housing that substantially extends over the length of the conductor, and an extended microwave decoupling area which follows the conductor and which is located in the housing. The housing is formed by at least one resonant cavity, which has a long shape and follows the course of the microwave antenna. The resonant cavity has at least one tapering, closed, first crown area and the decoupling area essentially extends in the focussing area of the resonant cavity. An at least non-divergent housing area adjoins the resonant cavity.

24 Claims, 14 Drawing Sheets

LINEARLY EXTENDED DEVICE FOR LARGE-SURFACE MICROWAVE TREATMENT AND FOR LARGE SURFACE PLASMA PRODUCTION

BACKGROUND OF THE INVENTION

The invention concerns a microwave generating device for the treatment of workpieces with at least one microwave antenna connected to a microwave source, the antenna having an elongated conductor for the production of alternating electromagnetic fields, with a housing forming a cavity resonator and with an output region for the microwaves located in a widening portion of the housing substantially in a focus region of the housing resulting from that widening, wherein an at least non-diverging housing region adjoins the widening portion of the housing.

WO 96/23318 (corresponds to DE 195 07 077 C1) discloses a plasma reactor categorizing the invention which comprises a rotationally symmetrical cavity in the form of an ellipsoidal resonator. The free end of a coupling pin is disposed at a first focusing point while a second focusing point of the ellipsoidal resonator is surrounded by a quartz cap thereby forming a plasma treatment region about that focusing point. Disadvantageously, the treatment region is small and concentrated only radially about the focusing point.

DE 195 03 205 C1 discloses a device for producing plasma in an underpressure container by means of alternating electromagnetic fields, wherein a rod-shaped conductor is guided, within a pipe of insulating material, through the underpressure container. The inner diameter of the pipe is larger than the diameter of the conductor and the pipe is filled with gas to prevent plasma from being generated therein. Plasma is produced in the direct surroundings of the pipe, since the rays are most intense at that location. The influence of the high energy input on the pipe, the change of the radiation due to impurities and the danger of forming a coating about the pipe are all disadvantages of this procedure.

DE 39 23 390 A1 discloses a device for generating a large area evaporated film using at least two separated activated gases. Towards this end, two microwave conducting cavities, each having its associated microwave generator, are disposed parallel to two opposite sides of a substantially rectangular housing. Rod antennas extend from the microwave generator in an alternating manner and at right angles to the extension of the conducting cavities, which are likewise parallel to each other, which penetrate into the housing, and which end and are terminated within the housing at the corresponding sides facing away from the respective conducting cavity. Standing microwaves of differing intensities are formed along the antennas. A certain degree of homogeneity is attained through the parallel configuration of the antennas and the staggered feeding thereof on opposite sides. This configuration is structurally demanding and therefore expensive.

It is the underlying purpose of the invention to further improve a device of this kind for the production of microwaves, in particular, for the continuous treatment of large workpieces.

SUMMARY OF THE INVENTION

This object is achieved in accordance with the invention with a device of this kind in that the cavity resonator has a longitudinal shape and follows the extension of a microwave antenna generating a homogeneous treatment zone throughout its length, wherein the extended output of the microwaves follows the conductor and substantially extends along the extended focal region of the cavity resonator.

It is also an underlying purpose of the invention to create a large microwave treatment region for the treatment of workpieces which is as homogeneous as possible and which also permits continuous treatment.

This latter purpose is achieved with a device of the above mentioned kind in that the housing is made from at least one elongated resonator which follows the extension of the microwave antenna, wherein the cavity resonator has at least one closed, tapered first tip region with the output region substantially extending along a the focal region of the cavity resonator, wherein at least a non-diverging housing region adjoins the widening tip region.

The invention produces a treatment zone which is homogeneous in its longitudinal direction and linearly extended for concentrating the microwaves at least for parallel orientation thereof, wherein the width of the treatment zone transverse to the longitudinal direction can be varied through suitable housing shapes.

The coupling of microwaves can be effected in different ways. In accordance with a first preferred embodiment, the microwave antenna is an electrically conducting elongated conductor which is surrounded by a dielectric and located at the focusing region of the cavity resonator, wherein either the dielectric is a solid body closely surrounding the conductor or the dielectric is formed by gas which can be radially limited by a dielectric pipe surrounding the conductor.

In an alternative embodiment, the microwave antenna is a coaxial, conducting structure with inner and outer conductors. The outer conductor can be a partial cylinder, which only partially surrounds the inner conductor and which is disposed at a region of the inner conductor facing away from the tip region of the cavity resonator. Alternatively, the outer conductor is a coating on a dielectric surrounding the inner conductor. The outer conductor may have at least one opening facing the tip region of the cavity resonator which is located in the focusing region of the cavity resonator and which is formed from slits or holes.

In a further embodiment, the microwave antenna is a waveguide with outlet openings disposed in the focusing region of the cavity resonator to function as the output region.

The microwaves can be introduced into the microwave conductor antennas either from one end or from both ends.

For thermal treatment of workpieces, the non-divergent region which adjoins the first tip region is formed by parallel walls. However, in a preferred embodiment, the non-divergent region is a second tip region continuously tapering from the first tip region, and the workpiece can be located substantially in the focusing region of the second tip region. The tapering region can have a parabolic or partially elliptical cross-section. In addition to microwave thermal treatment, this embodiment is particularly suited for plasma treatment of material, wherein the plasma treatment region must be separated from the microwave production region for controlling the gases used, in particular with respect to pressure, gas type and gas flow.

This latter requirement can be realized if the separating body is substantially a flat wall, or if the separating body is a semi-cylindrical coating disposed above the treatment focus and rigidly and closely connected to the housing wall. Alternatively, the separating body is a dielectric pipe which surrounds the treatment focus.

In a further preferred embodiment, the first tip region and the non-divergent region are disposed at a finite angle with respect to one another and a reflecting surface is provided between the two regions, in particular, for preventing emitted vapor or drops of liquid from impinging on the microwave antenna during the treatment of workpieces.

To increase the microwave intensity in the treatment region, at least two first tip regions, each comprising a microwave antenna, can be disposed parallel to one another to merge into a common non-divergent region. In accordance with a first alternative embodiment, the at least two first tip regions are disposed next to one another.

In a further embodiment, two microwave antennas are disposed diagonally opposite to one another relative to a second treatment focus. To further increase the energy input, in particular during plasma treatment, several microwave antennas in associated cavity resonators can also be provided which are symmetrically disposed about a treatment focus.

In a further embodiment, several microwave antennas are disposed in parallel, next to one another and in their associated cavity resonators at least on one side of a workpiece. This increases the treatment region.

The inventive device can be used in different ways.

In a first application variant, winding mandrels can be provided for the treatment inside the housing and at least one deflecting or guiding means is disposed in the vicinity of the working focus. In accordance with the invention, a mixer is disposed in the treatment region for microwave treatment of bulk material. Treatment is thereby discontinuous and the bulk material in the plasma treatment room must be exchanged after treatment. For quasi-continuous treatment, a screw conveyor is disposed in the region of the working focus to supply the material to be treated. For exhausting waste gas, a gas guiding pipe is disposed to extend along the treatment focus and is provided with a pump.

BRIEF DESCRIPTION OF THE DRAWINGS

Further advantages and features of the invention can be extracted from the claims and the following description which describes in detail embodiments of the invention with reference to the drawings.

DESCRIPTION OF THE PREFERRED EMBODIMENT

Figure 1A:
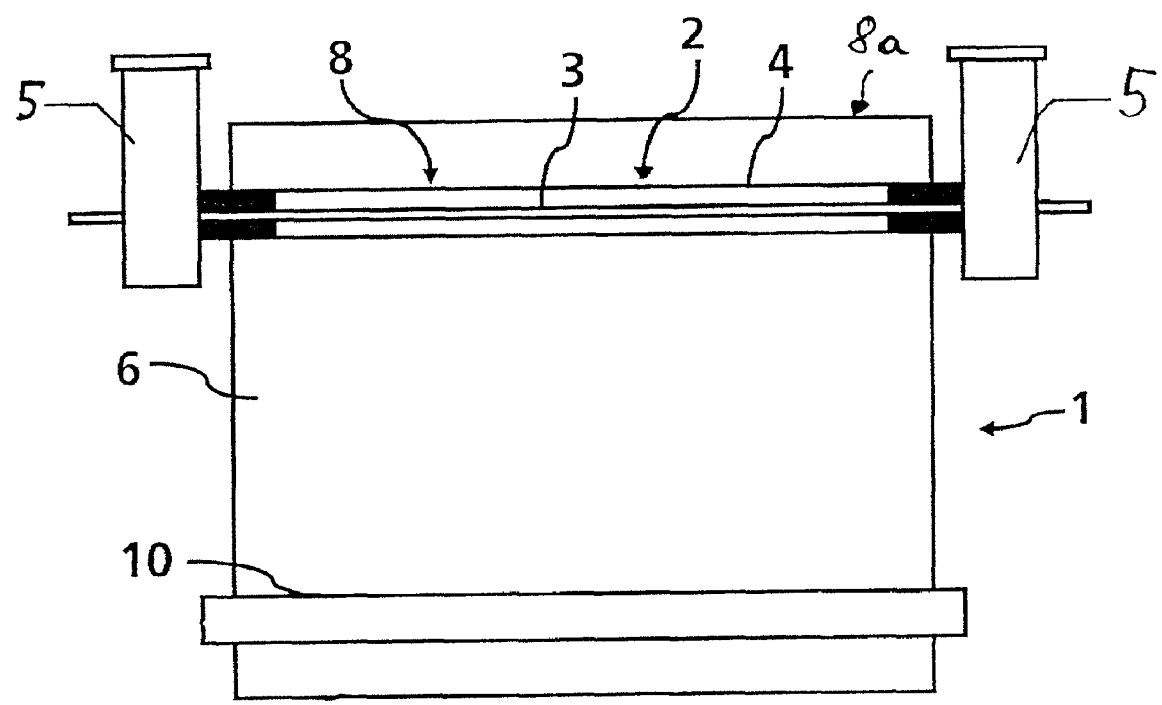
FIG. 1*a* shows a longitudinal section of an inventive embodiment of a device for producing microwaves and plasma treatment with a linear conductor disposed in a dielectric.
Figure 1B:
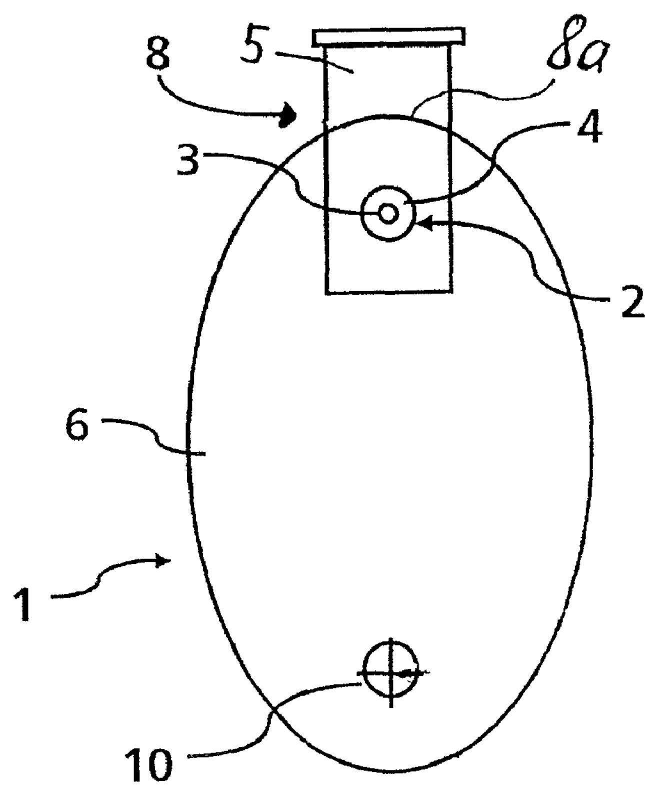
FIG. 1*b* shows a cross-section of the embodiment of FIG. 1*a;*

In the embodiment of FIGS. 1*a* and 1*b*, the inventive device 1 for producing microwaves has an elliptic cross-section and comprises a microwave antenna 2 with an elongated linear conductor 3 in the form of a rod, wire or copper pipe which is surrounded by a dielectric 4, e.g. in the form of a quartz pipe or ceramic rod disposed at a separation and containing air.

The microwaves are input via one or both ends of the conductor 3, usually through microwave adapters (not shown in detail).

Figure 1C:
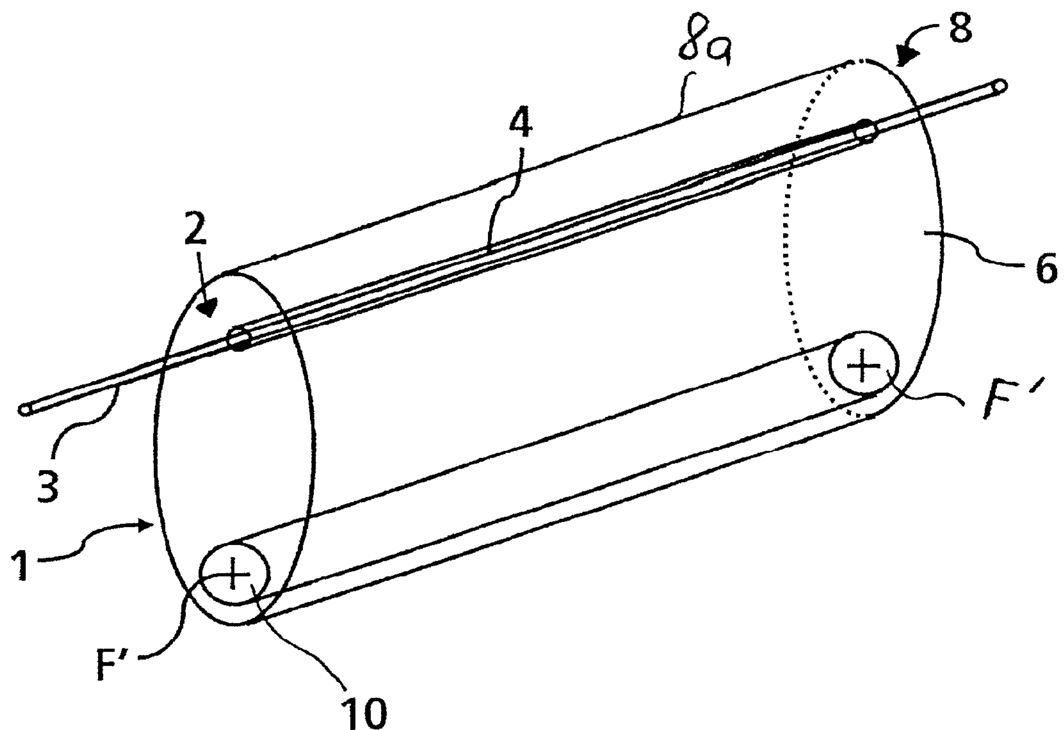
FIG. 1*c* shows a perspective view of the additional embodiment of FIGS. 1*a*, 1*b;*

The described microwave antenna 2 is in an adjoining elongated cavity resonator 6 of at least partially parabolic or elliptic contour (in the present example of elliptic cross-section) which has a first tip region 8 extending parallel to the antenna 2 or conductor 3 and having a first focusing region defined by the line of focus of parallel, symmetrically incident rays. In the embodiment of FIGS. 1*a*, 1*b*, and 1*c*, the linear conductor 3 is located exactly in the focusing region of the cavity resonator 6 or its (first) tip region 8. In this embodiment, the cavity resonator 6 comprises a second tip region with a second elongated treatment focusing region F' designated with a cross (X), which is surrounded by a pipe 10 in which plasma is produced for plasma treatment of a workpiece, e.g. sealing in a plasma phase of a gas.

Figure 2:
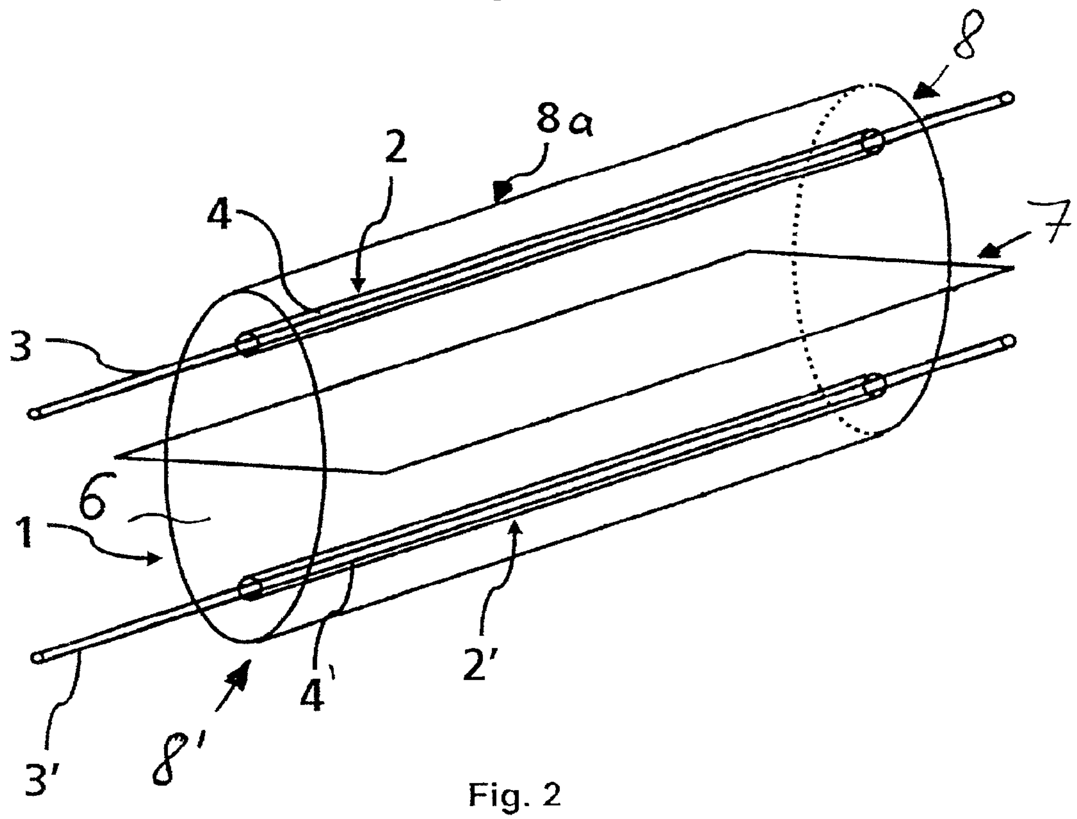
FIG. 2 shows an inventive device for producing microwaves with two microwave antennas.

The inventive device can also be used for heating a workpiece 7 (indicated in FIG. 2), such as a sheet, e.g. for drying the sheet or for curing a layer disposed thereon. FIG. 2 shows such an application. A cavity resonator 6 comprising two first tip regions 8,8' has an elliptic cross-section in this embodiment. Two microwave antennas 2,2' and their wire-shaped (inner) conductors 3,3' are located in the focusing regions of the cavity resonator 6 for heating at a separation from the microwave antennas 2,2' by the microwave antenna radiation thereof.

Heating only from one side is also fundamentally possible in a cavity resonator 6 of parabolic or semi-elliptical shape. Further embodiments of the invention are described below.

Figure 3:
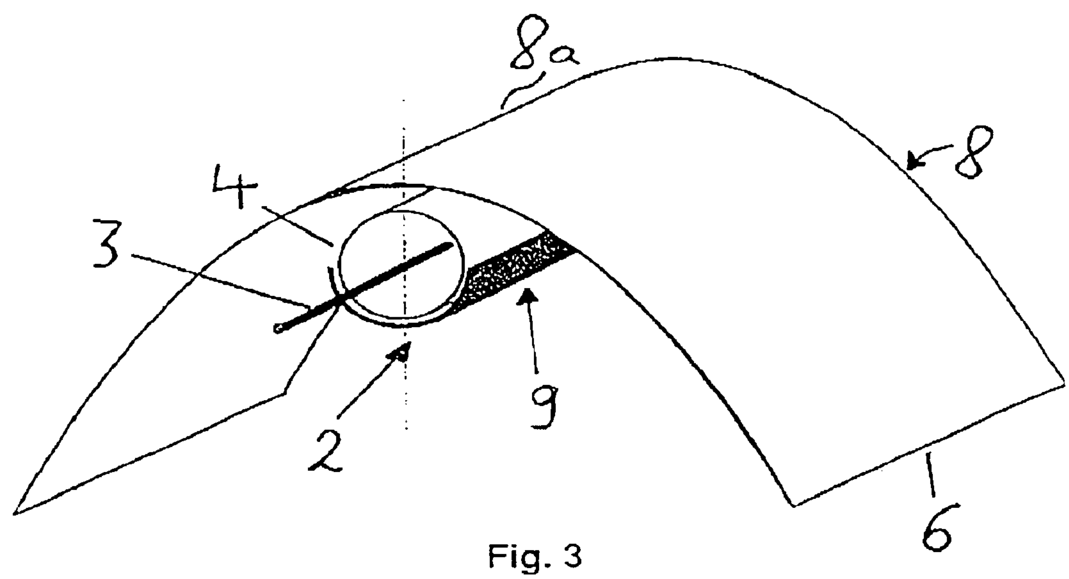
FIG. 3 shows another embodiment of the inventive device comprising a linear conductor shielded by a partially open conductive coating.

In the embodiment of FIG. 3, a partially open coaxial conductor structure is disposed within the cavity resonator 6 for microwave input. The conductor structure is formed by an inner conductor 3 disposed in a dielectric 4. The dielectric has a partially open conducting coating 9 disposed coaxially to the conductor in the region facing away from the tip 8*a* of the cavity resonator 6. Microwave radiation is thereby directed towards the tip 8*a* (end face region) of the cavity resonator and reflected into the remaining region of the cavity resonator and onto the workpieces to be treated (further details below).

Figure 4:
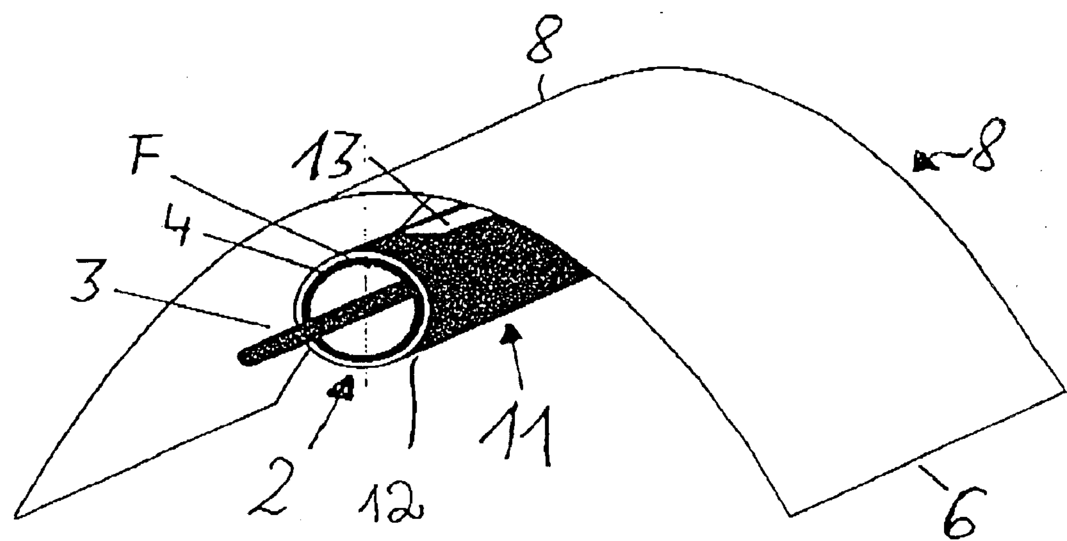
FIG. 4 shows an embodiment comprising a coaxial conductor with slitted outer conductor.
Figure 5:
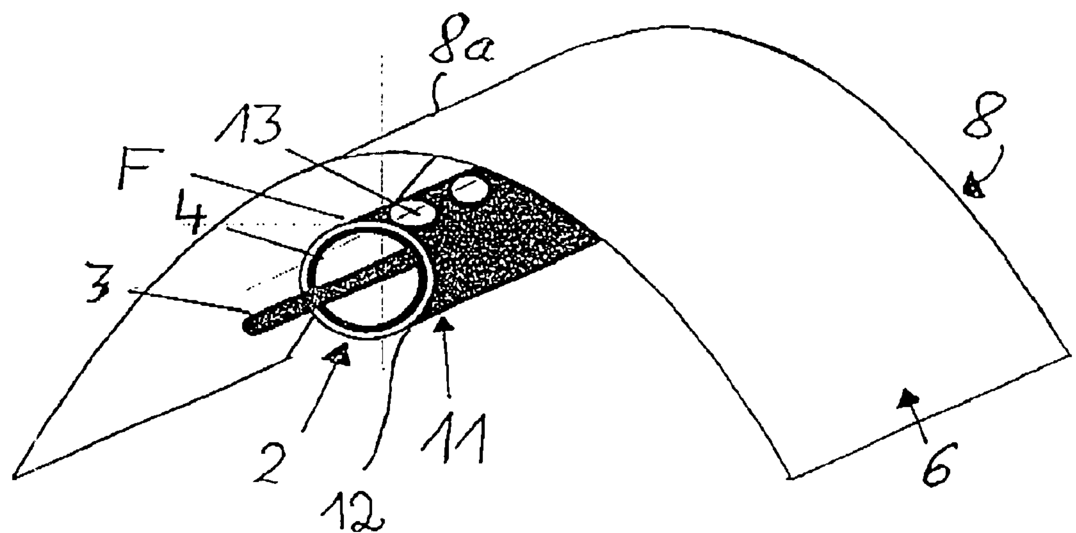
FIG. 5 shows an embodiment in accordance with FIG. 4, wherein the outer conductor is punched.

FIGS. 4 and 5 also show a coaxial conductor structure forming a microwave antenna 2. In this embodiment, a conductor 3 is surrounded at a separation by a conducting pipe (outer conductor 12) which has outlet slits or circular holes 13 on its side facing the tip 8*a* of the cavity resonator 6. In the embodiment of FIG. 4, the microwave radiation is therefore guided as in FIG. 3. The ratio between slit length and width is advantageously constant over the entire length of the coaxial conductor 11. This is, however, not absolutely necessary.

While in the embodiments of FIGS. 1 and 3, the conductor or inner conductor 3 is in the focusing region of the cavity resonator 6, this is not the case in FIGS. 4 and 5. In these embodiments, the plane of the outlet slits 13 is disposed in the focusing region F of the cavity resonator 6.

Figure 6:
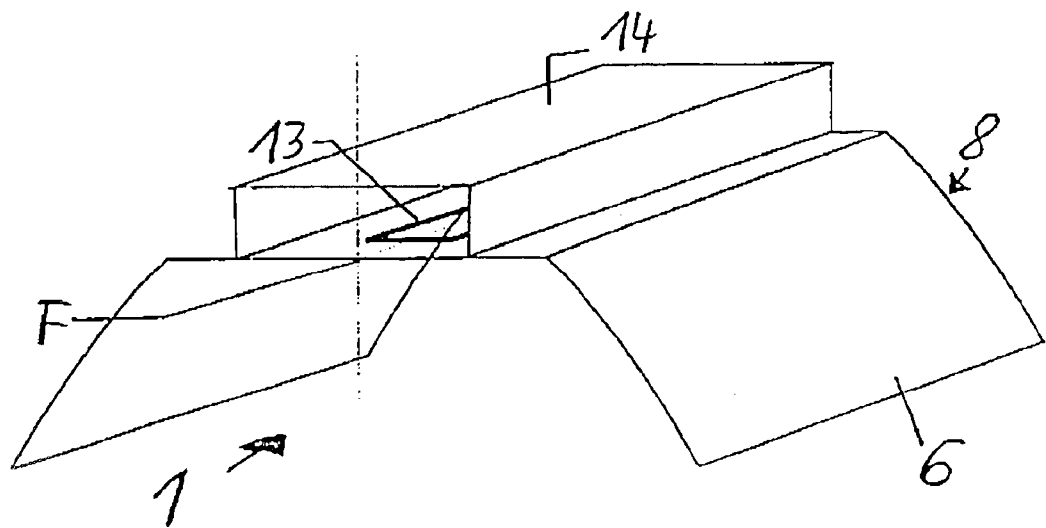
FIG. 6 shows a further embodiment of the inventive device comprising a slatted waveguide.

The embodiment of FIG. 6 of an inventive device shows a waveguide 14 as microwave conductor which is disposed in the upper region of the cavity resonator 6 such that the outlet slits 13 of the waveguide 14 facing the inside of the cavity resonator 6 are also in the focusing region F of the cavity resonator, indicated by a cross. The absent tip of the cavity resonator is indicated therein.

Figure 7:
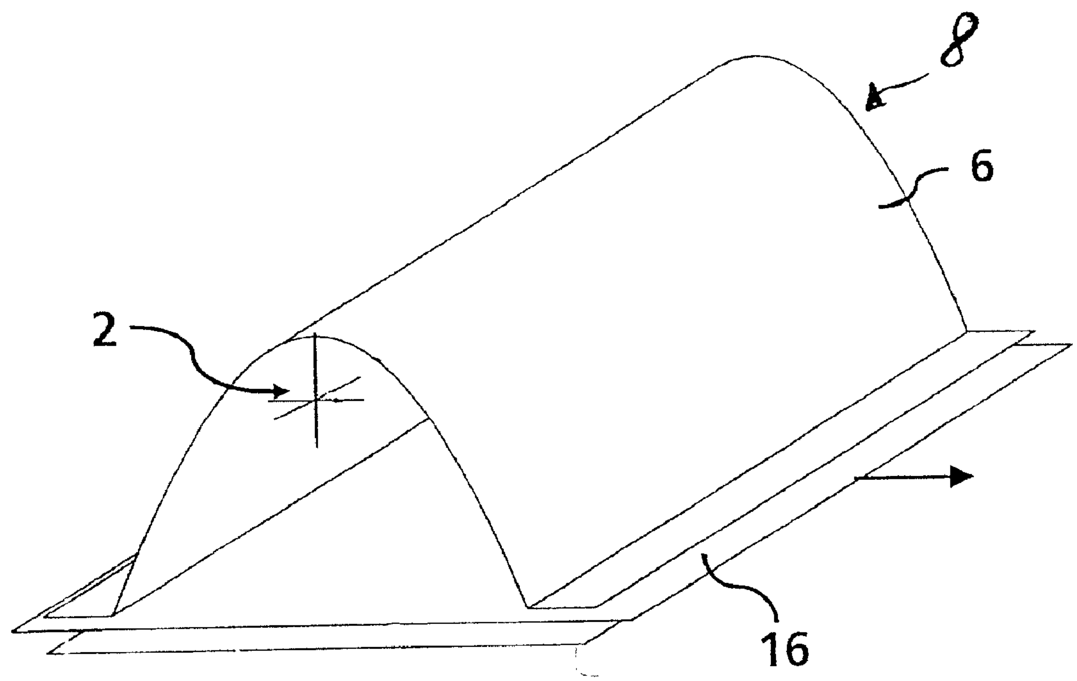
FIG. 7 shows a further schematic representation of a first embodiment for the microwave radiation of sheets.

FIG. 7 shows a cavity resonator 6 with only one first tip region 8 for microwave treatment of a workpiece 16 in the form of a material sheet extending below the tip region.

Figure 8:
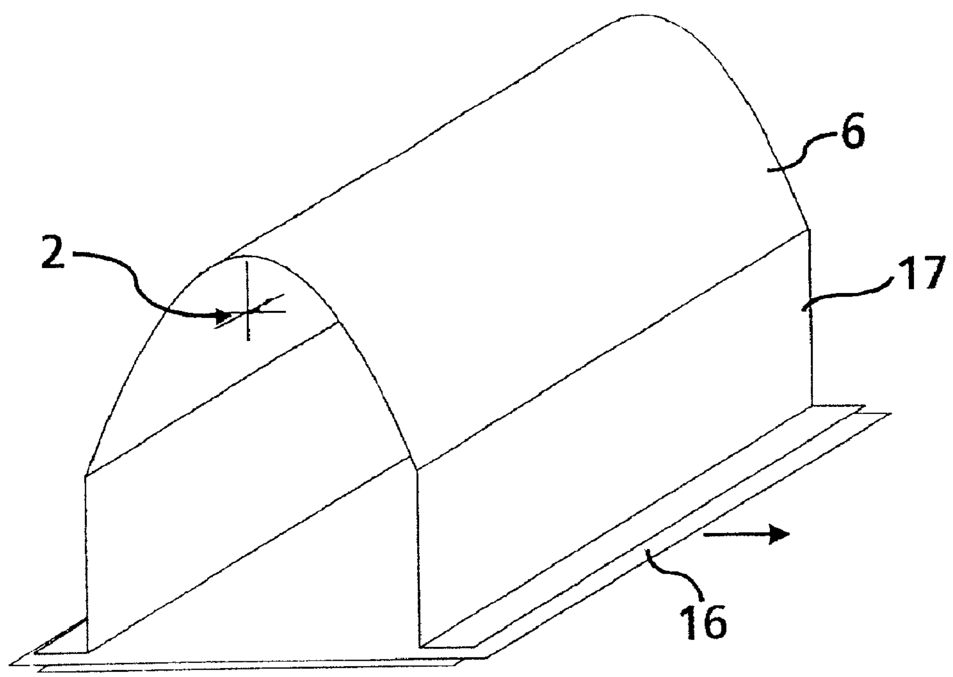
FIG. 8 shows a further schematic representation of a second embodiment for the microwave radiation of sheets.

For certain reasons, it may be required to chose a larger separation between the microwave antenna 2 and the workpiece 16 to be treated. For this reason, a spacer 17 with parallel walls adjoins the parabolic or partially elliptic tip region 8 of the cavity resonator 6 in the embodiment of FIG. 8 of the inventive device. The workpiece 16 extending below the microwave antenna 2 adjoins the spacers 17. This embodiment having spacers 17 can also be symmetrical with two microwave antennas in correspondence with FIG. 2.

The sheet, in general a workpiece, can also be located in a treatment focusing region F' of a cavity resonator 6 or of a second tip region having different structural parameters than the first tip region 8 focusing the microwaves produced by the microwave antenna 2 located therein, e.g. can have a cross-sectional shape of a flatter parabola.

Figure 9:
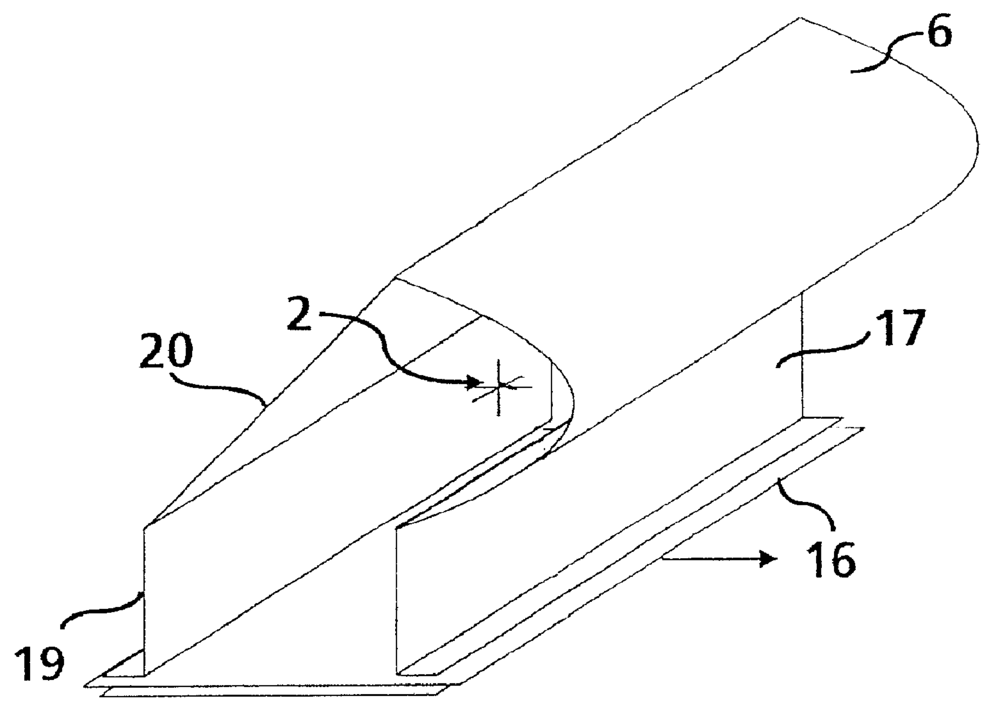
FIG. 9 shows a further schematic representation of a third embodiment for the microwave radiation of sheets.

For certain reasons, it might be reasonable or necessary not to direct the microwave radiation directly onto the workpiece, e.g. if vapor or liquid exits therefrom during treatment which can soil and possibly damage the microwave antenna. This is prevented in the embodiment of FIG. 9. In this embodiment, a housing section 19 with parallel walls adjoins the first tip region 8 at an angle, preferably right angles, wherein the workpiece 16 is drawn through below its end. An angularly disposed reflector surface 20 is provided between the first tip region 8 and the housing part 19 to direct the microwaves produced in the microwave antenna 2 onto the workpiece 16.

Figure 10:
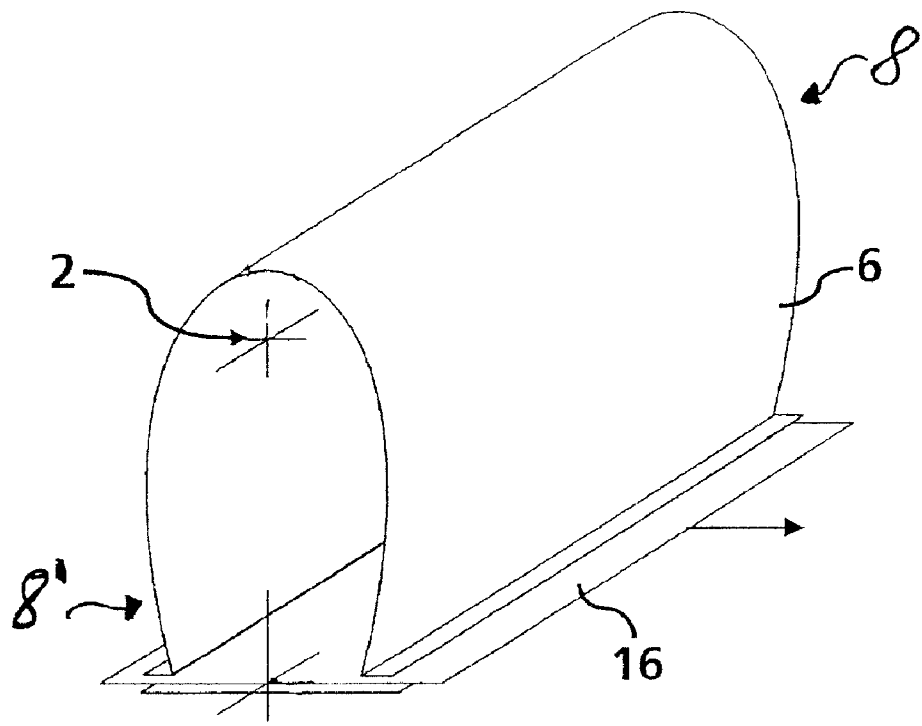
FIG. 10 shows a first embodiment for microwave radiation of a sheet with increased heat input into the sheet.
Figure 11:
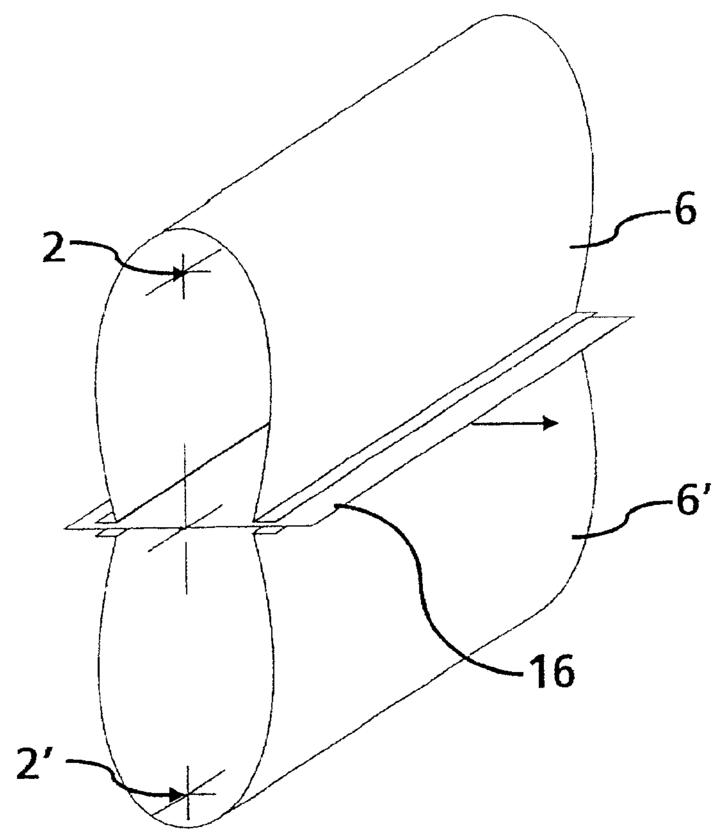
FIG. 11 shows a second embodiment for microwave radiation of a sheet with increased heat input into the sheet.

To increase the intensity of the microwave treatment in a treatment region oriented transverse to the transport direction of the workpiece 16 and parallel to the microwave antenna 2, a cavity resonator 6 with two focusing regions can be provided in which the microwave conductor or the outlet region of the microwaves is disposed in the manner described in FIGS. 1 through 4, wherein the workpiece is drawn through the other treatment focus region F' (FIG. 10). In this embodiment, the microwaves produced by the microwave antenna 2 are focused into the second focusing region F' and thereby onto the workpiece. For a two-sided treatment, a corresponding cavity resonator 6' having a second microwave antenna 2' can be provided, as shown in FIG. 11, at the side of the workpiece 16 facing away from the microwave antenna 2 and the first tip region 8.

Figure 12:
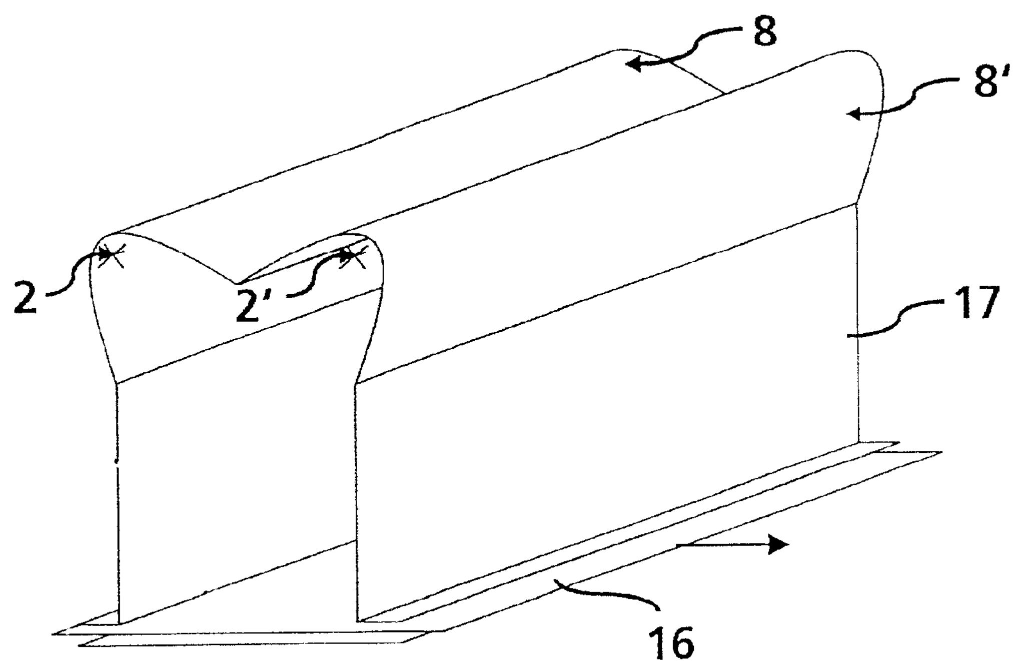
FIG. 12 shows an embodiment for microwave radiation of a sheet comprising two parallel microwave sources.

To increase the one-sided intensity of the microwave treatment of a workpiece 16, two microwave antennas 2,2' can be disposed on one side in first tip regions 8,8' associated therewith, wherein the tip regions 8,8' of the cavity resonator, in particular their symmetrical surfaces which extend at an angle with respect to another, are disposed and oriented such that the treatment regions 22 of both microwave antennas 2,2' substantially coincide (FIG. 12).

Figure 13:
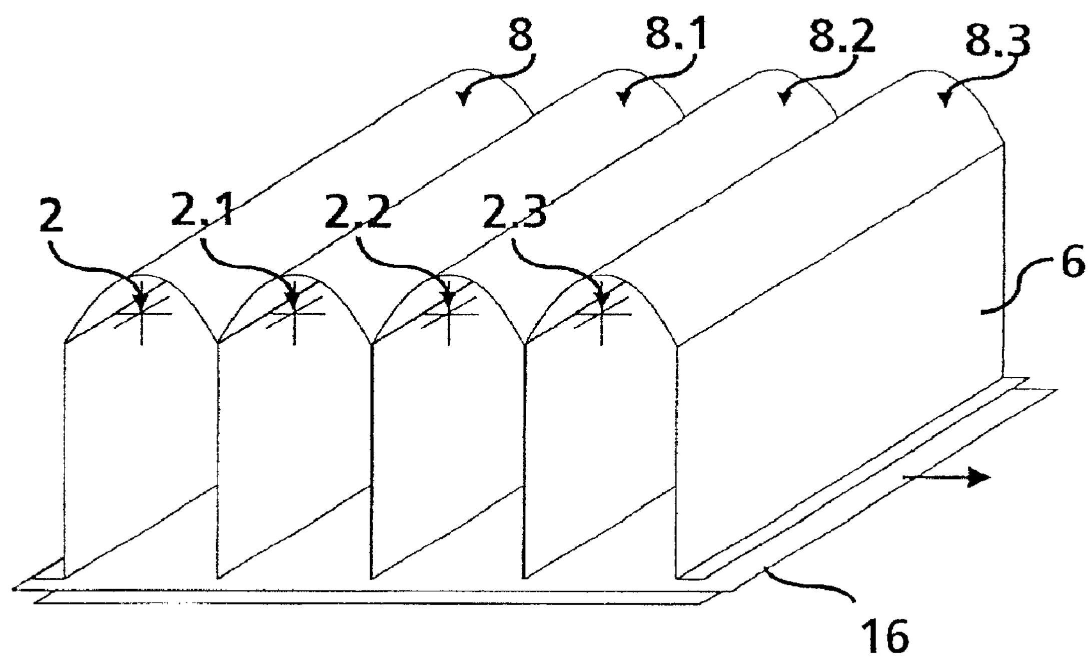
FIG. 13 shows a further embodiment of an inventive device for microwave radiation of a sheet with several, adjacent microwave antennas.

Moreover, it may be required to treat a workpiece 16, e.g. a sheet, over a longer period of time or a longer sheet with microwaves which is not possible with a microwave antenna or two microwave antennas directed onto the same region. In this case, several microwave antennas 2,2.1,2.2.,2.3 . . . . can be oriented next to and parallel to one another and disposed in first tip regions 8,8.1,8.2,8.3 . . . . of the cavity resonator whose symmetrical central surfaces are disposed parallel to one another (see FIG. 13).

The workpiece must not be a sheet but can also be bulk material or the like transported on a conveyor belt through the treatment region. In addition to thermal treatment of such workpieces in the above-described fashion, the inventive device can also be used for plasma coating of a workpiece or of workpieces using microwaves.

In this case, the plasma treatment zone in which the workpiece or workpieces are located must be physically separated from the microwave producing region in which the microwave antenna 2 is located, since the conditions of the gases in the microwave producing region and in the plasma treatment zone must be different to prevent production of plasma in the microwave producing regions and to produce plasma in the plasma treatment zone.

Advantageously, the microwave concentration in the plasma treatment zone is increased for producing plasma by providing a second focusing region F' in the plasma treatment zone in addition to the first focusing region in which the microwave antenna 2 is located. As above, these zones are indicated by crosses (X) in the figures described below.

Figure 14:
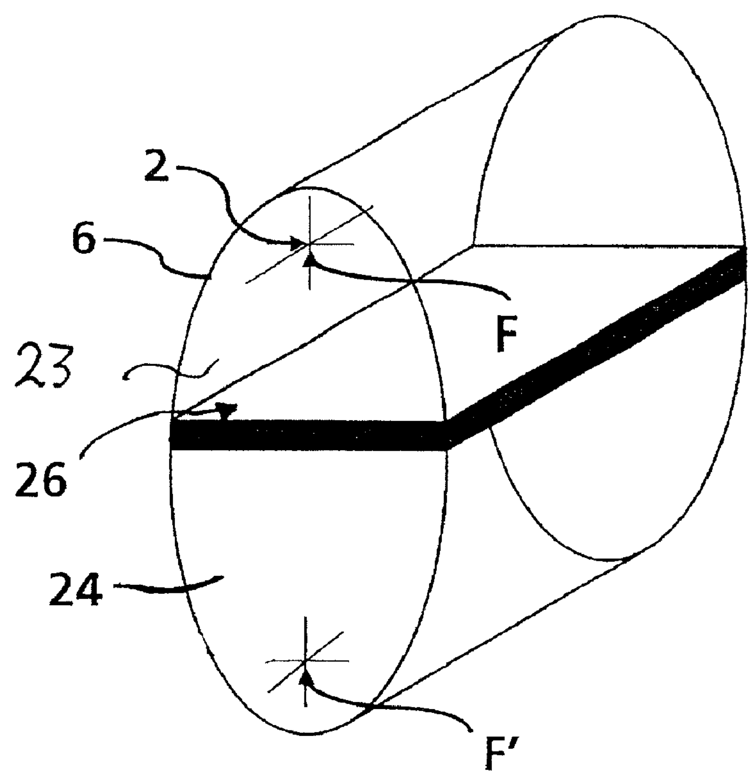
FIG. 14 shows a first embodiment of the inventive device for producing plasma, in particular for coating objects.

In the embodiment of FIG. 14, the microwave producing zone 23 and the plasma treatment zone 24 are only separated by a separating wall 26 of dielectric material.

Figure 15:
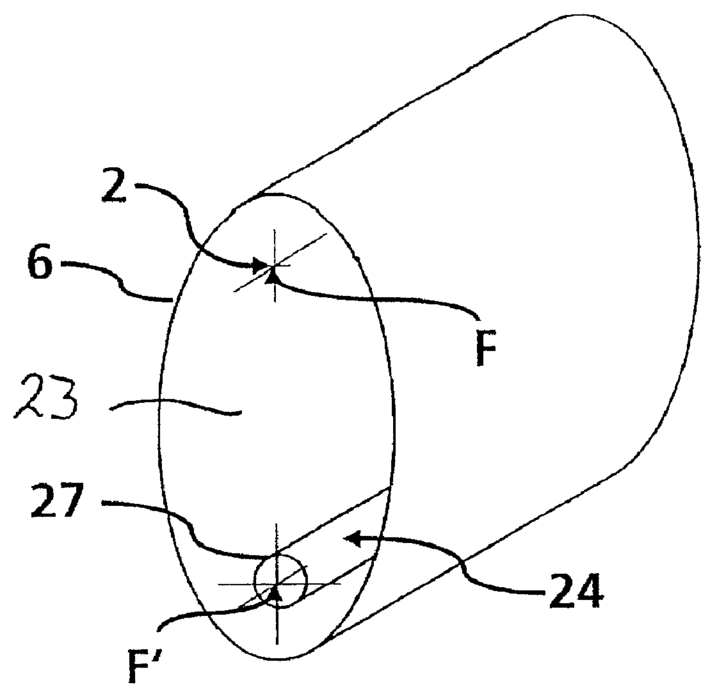
FIG. 15 shows a second embodiment of the inventive device for producing plasma, in particular for coating objects.

In the embodiment of FIG. 15, the plasma treatment zone is surrounded by a pipe 27 introduced into the cavity resonator 6.

Figure 16:
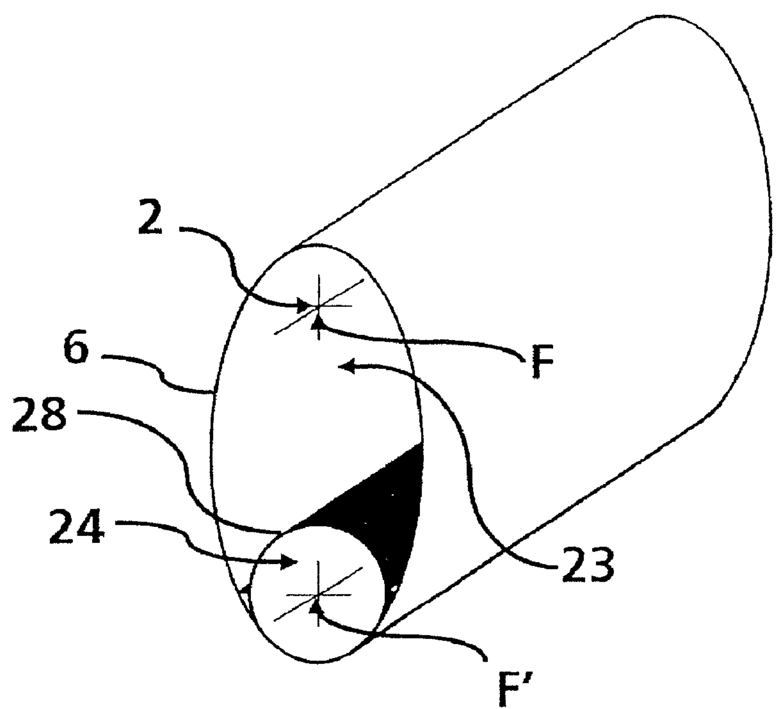
FIG. 16 shows a third embodiment of the inventive device for producing plasma, in particular for coating objects.

In the embodiment of FIG. 16, the plasma treatment zone 24 about the focusing region F' in the first end region 8 is separated from the microwave producing region 23 by a partial cylinder 28, which is connected to first end region walls in a gas-tight manner.

Figure 17:
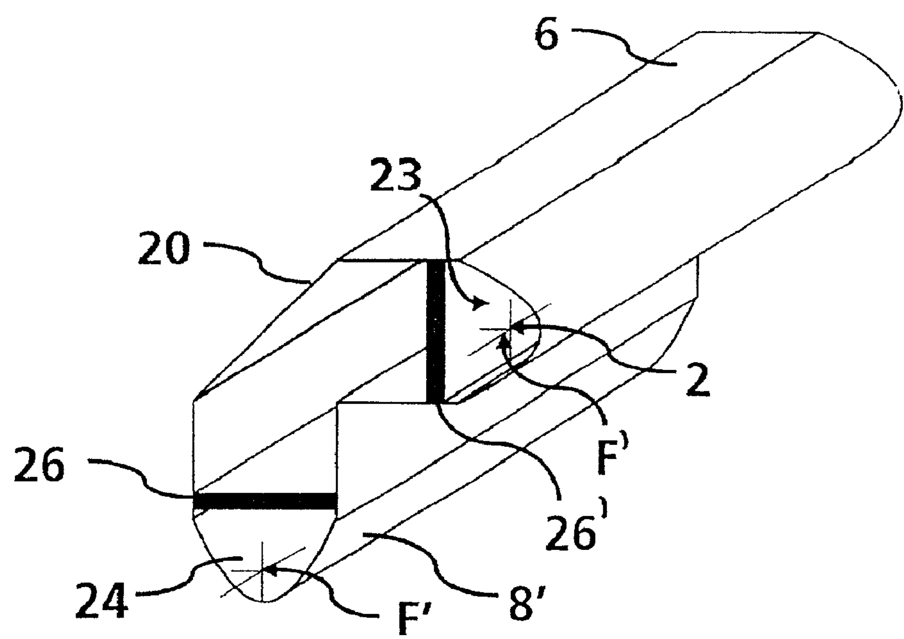
FIG. 17 shows a fourth embodiment of the inventive device for producing plasma, in particular for coating objects.

In the embodiment of FIG. 17, the first tip region 8 surrounding the microwave antenna 2 and the second tip region 8' surrounding the focusing region F' in the plasma treatment zone are disposed at an angle with respect to one another, i.e. their central planes are not aligned but oriented at an angle. The microwave radiation acts in a similar fashion as in the embodiment of FIG. 9 via a reflector surface 20 disposed at an angle with respect to the microwave antenna 2 for reflection into the plasma treatment zone at the second focusing region F'. A second separating wall 26' can be provided in addition to the separating wall 26.

Figure 18:
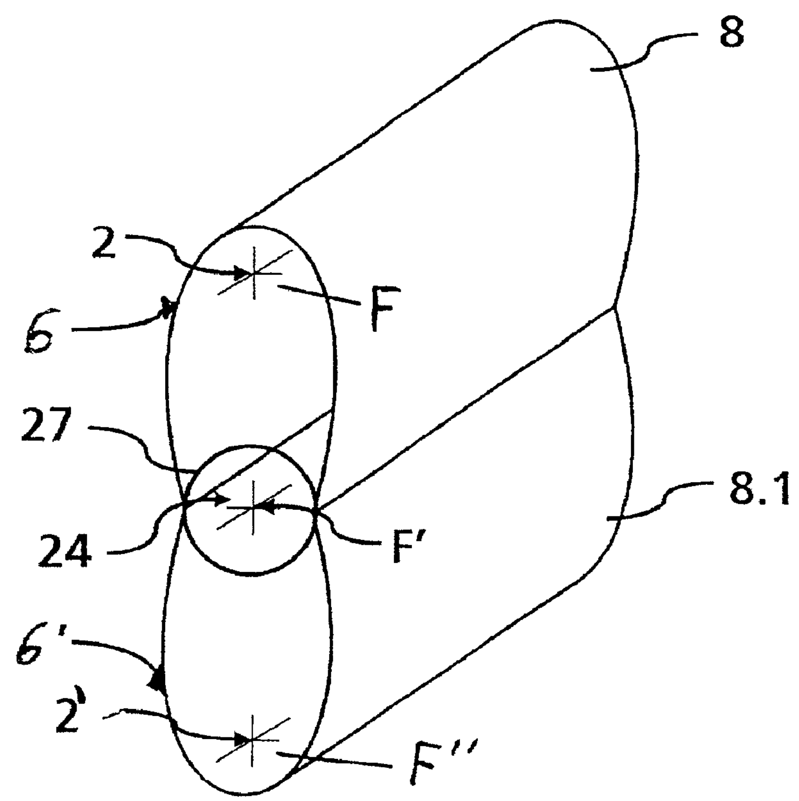
FIG. 18 shows a first embodiment for producing plasma using two or more microwave antennas which extend parallel to one another.
Figure 19:
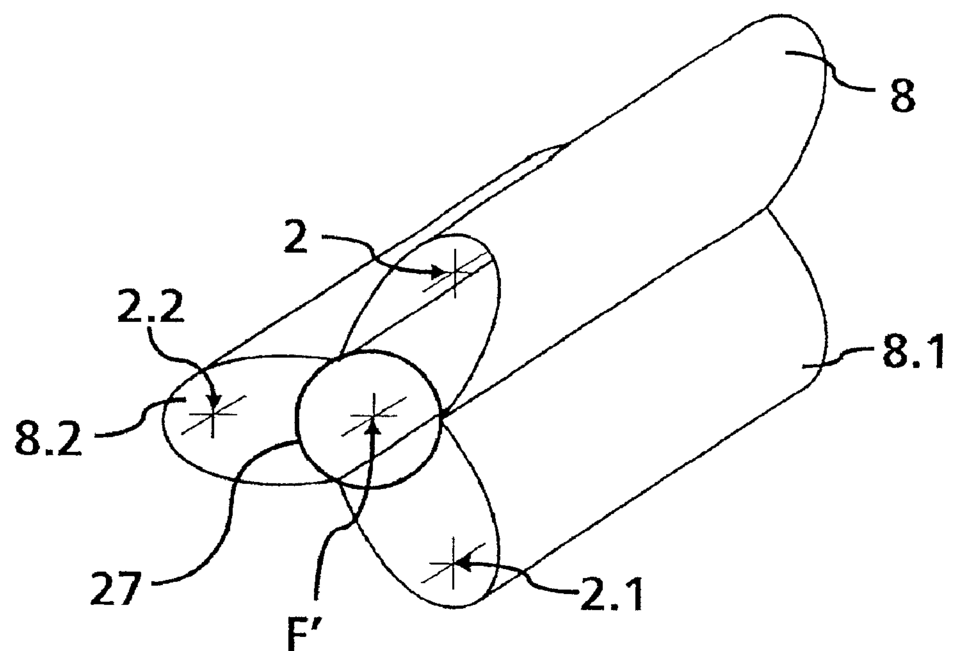
FIG. 19 shows a second embodiment for producing plasma using two or more microwave antennas which extend parallel to one another.
Figure 20:
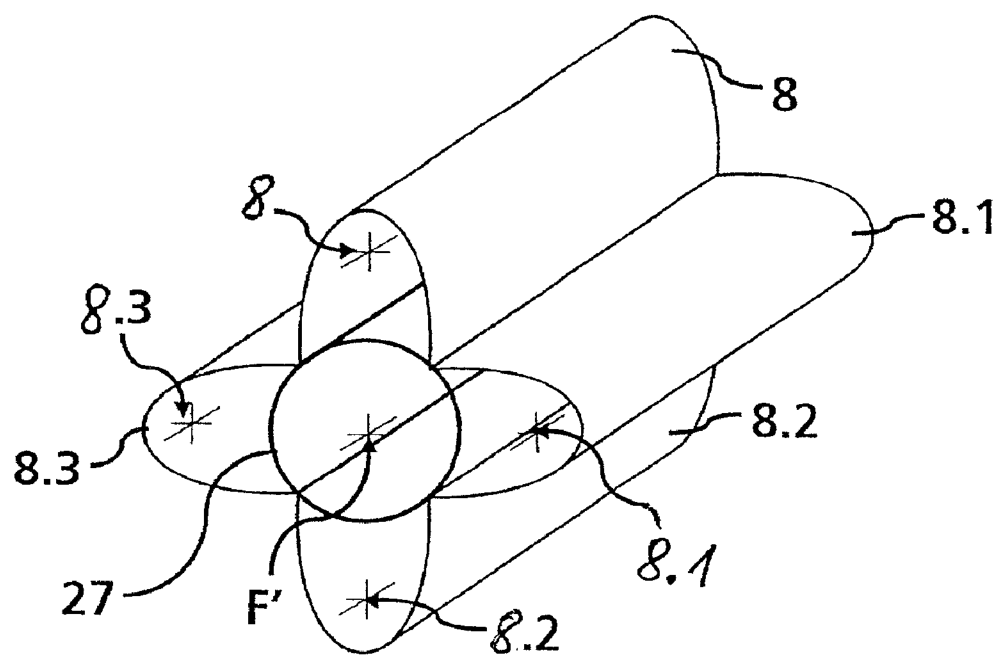
FIG. 20 shows a third embodiment for producing plasma using two or more microwave antennas which extend parallel to one another.

Several microwave antennas 2,2.1,2.2 . . . can be provided to increase the microwave input into the plasma treatment zone 24 (see FIGS. 18 through 20). When producing microwaves for plasma treatment, the (several) microwave antennas 2,2.1 . . . . are thereby disposed symmetrically about the plasma treatment zone 24 ard the second focusing region F' of the device, which is the same for all microwave antennas. For the case of two microwave antennas 2,2.1, the antennas are disposed diagonally with respect to a treatment focus F' extending through the two microwave antennas and the intermediate treatment focus F, (FIG. 18). For three microwave antennas 2,2.1,2.2, the antennas are located at an angle of 120° about the treatment focus F' (FIG. 19). For four microwave antennas, the antennas are correspondingly disposed at angles of 90° about the treatment focus F' (FIG. 20) etc.

For thermal treatment, a single workpiece, e.g. a sheet workpiece 16, can be drawn through the treatment region below the microwave source thereby entering and exiting same. However, this is not possible for plasma treatment of a workpiece, such as plasma coating of a sheet. The entire workpiece must remain in the plasma treatment region during treatment. Correspondingly, in the embodiment of FIG. 21, two winding mandrels 31,32 are provided in the plasma treatment region 24, wherein the sheet is unwound from one (e.g. 31) and wound onto the other (32).

Figure 21:
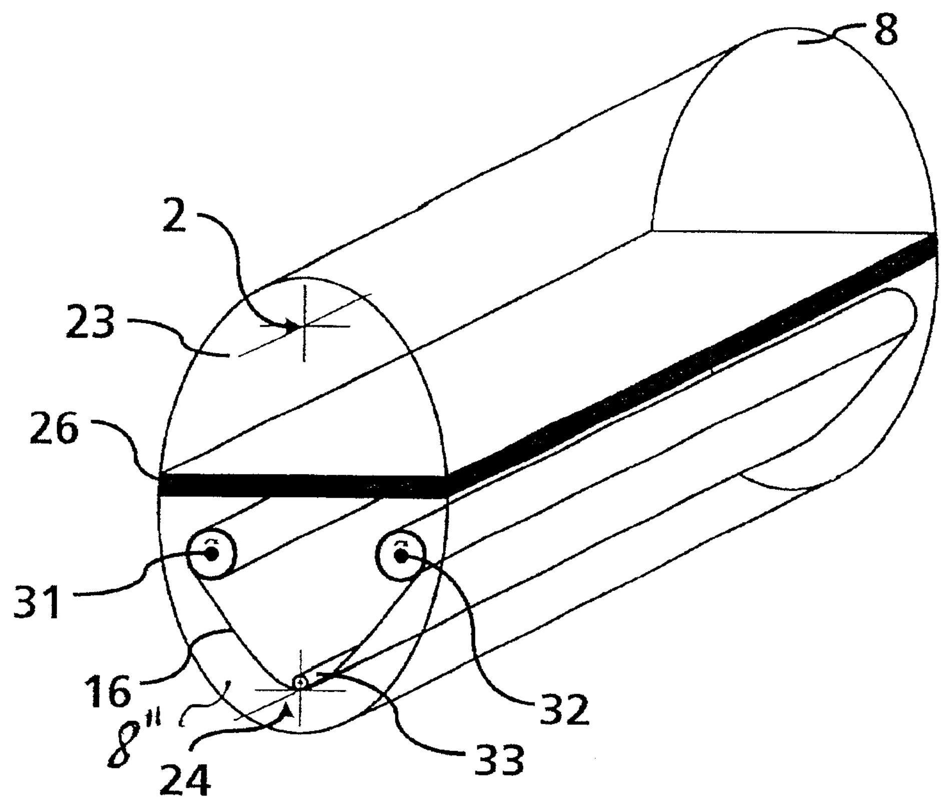
FIG. 21 shows an embodiment for continuous plasma treatment of a sheet.

Since the winding mandrels 31,32 should be located directly in the treatment i.e. application zone or in the second focus, however, the goods to be treated must be guided therethrough, and on the other hand, the design of the housing or the wall of the plasma treatment region determines the spatial relationship for producing the second focusing region, the embodiment of FIG. 21 includes a deflecting roller 33 in the focusing region to guide the sheet 16. It is also possible to dispose several guiding rollers parallel to one another in the focusing region.

Figure 22:
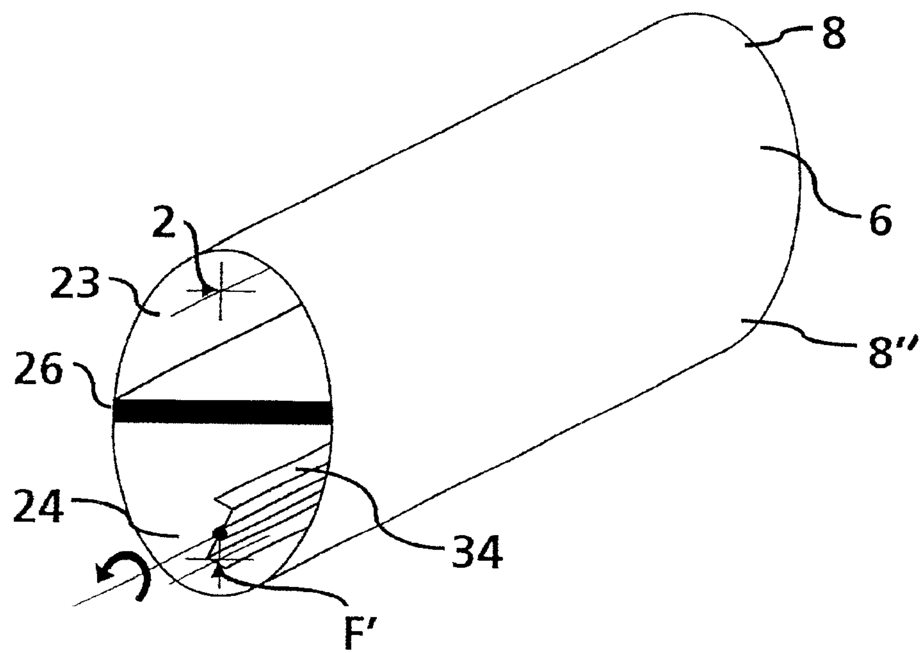
FIG. 22 shows an embodiment for plasma treatment of bulk material comprising a mixer.

The embodiment of FIG. 22 concerns the microwave plasma treatment of bulk material. To ensure uniform and good coating of all parts of the bulk material, the plasma treatment zone 24 of the embodiment of FIG. 20 includes a mixer 34 whose axis preferably extends parallel to the microwave antenna 2.

Figure 23:
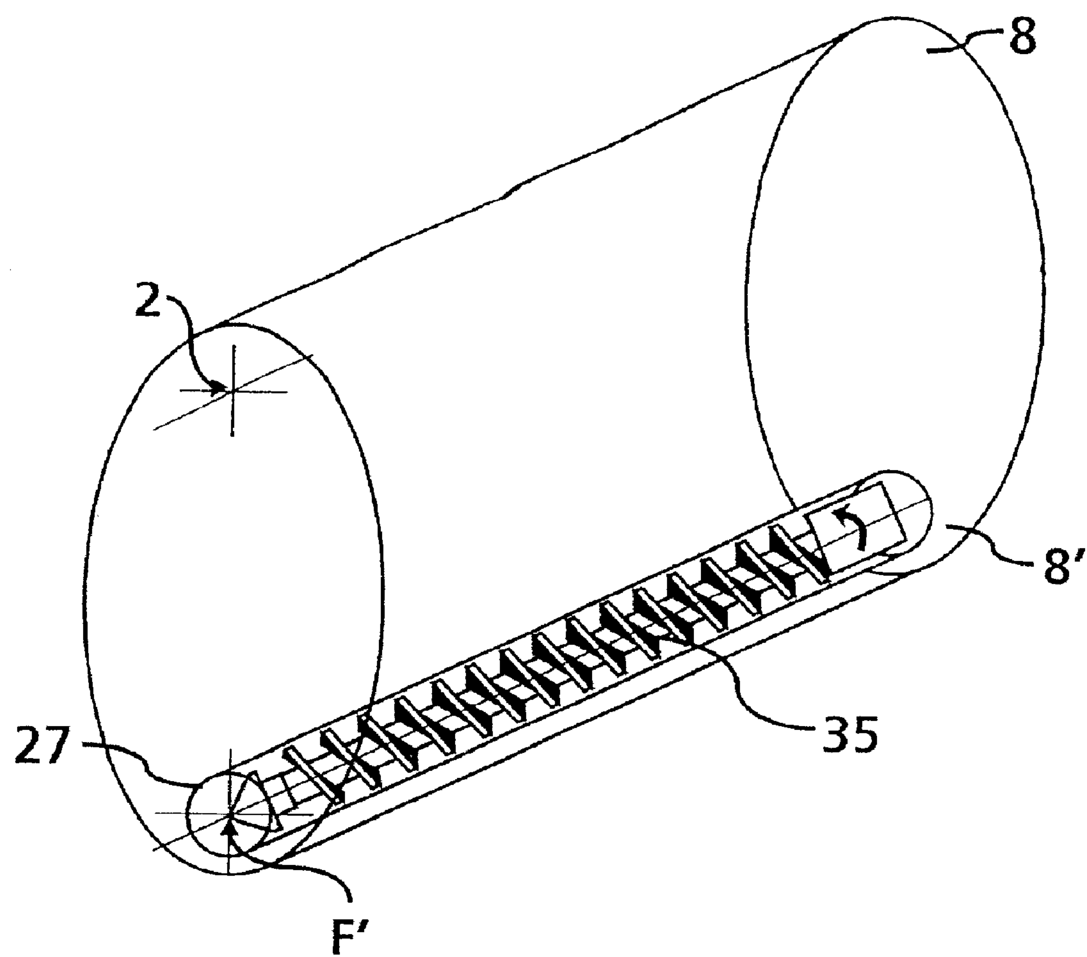
FIG. 23 shows a device for continuous microwave treatment of the medium in a screw conveyor as well as a device for waste gas purification through microwaves.

While the embodiment of FIG. 22 provides discontinuous treatment of the material to be treated, the embodiment of FIG. 23 shows an alternative to the continuous microwave treatment. Towards this end, a worm conveyor is provided in the region of the treatment focus F' for continuous supply of the goods to be treated from a supply container into a receptacle. During plasma treatment, the space defined by the container and the jacket of the worm conveyor 35 must be sealed and contain a treatment gas in a suitable manner. This is not required for continuous heat treatment of bulk material supplied by a worm conveyor 35, e.g. for drying the bulk material.

Figure 24:
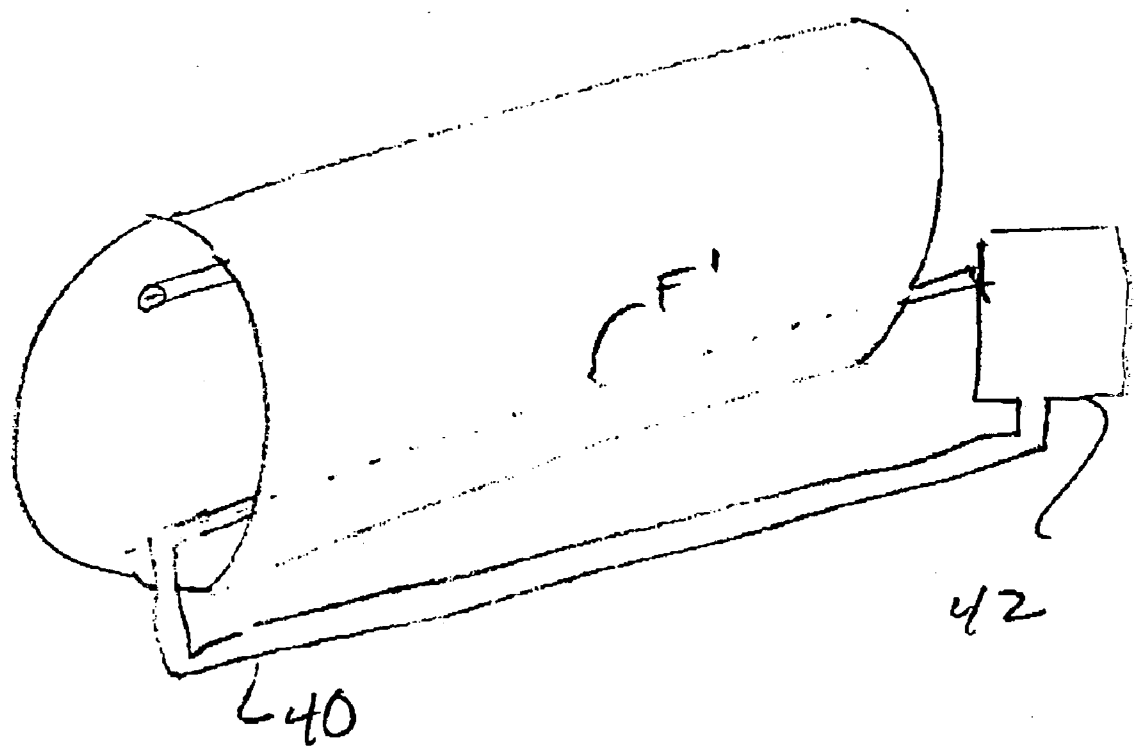
FIG. 24 shows a device for treating waste gas.

In accordance with the invention as illustrated in FIG. 24, treatment of waste gas is also possible waste gas is supplied along the focusing line F' in a pipe by means of a supply pump 42, e.g. a water jet pump.

We claim:

1. A device for producing microwaves to treat a workpiece, the device comprising:

a microwave source;

a housing defining a microwave resonator cavity, said resonator cavity having an elongated shape, said resonator cavity having a cross section extending substantially perpendicular to a direction of said elongated shape, said cross section having a widening portion defining a first tip region of said resonator cavity in which a first focus region of said cavity, resulting from that widening, is located, said housing also having a non-diverging housing region adjoining said widening portion of said housing; and microwave radiating means, said radiating means having a microwave antenna connected to said microwave source, said microwave antenna having an elongated conductor for producing alternating electromagnetic fields, said radiating means defining an output region for microwaves, said output region following said conductor and extending substantially along said first focus region, said microwave antenna having an elongated extension substantially following said elongated shape of said cavity, said microwave antenna and said resonant cavity producing a substantially homogeneous treatment zone along their lengths.

2. The device of claim 1, wherein said elongated conductor of said microwave antenna is surrounded by a dielectric and disposed in said first focus region of said first tip region.

3. The device of claim 2, wherein said dielectric is a solid body closely surrounding said conductor.

4. The device of claim 2, wherein said dielectric comprises a pipe surrounding said conductor at a separation, wherein a gas is disposed within said pipe.

5. The device of claim 1, wherein said microwave antenna comprises a coaxial conductor having an inner and an outer conductor.

6. The device of claim 5, wherein said outer conductor is a partial cylinder which surrounds only parts of said inner conductor and which is disposed in a region of said inner conductor facing away from said first tip region of said resonator cavity.

7. The device of claim 6, wherein said outer conductor is a coating on a dielectric surrounding said inner conductor.

8. The device of claim 5, wherein said outer conductor has at least one slit facing said first tip region of said resonator cavity which is located in said first focus region of said first tip region.

9. The device of claim 1, wherein said microwave antenna comprises a wave-guide with an outlet opening defining an output region, said outlet opening disposed in said first focus region of said first tip region.

10. The device of claim 1, wherein said non-diverging region defines a second tip region tapering from said first tip region and having a second focus region defining a treatment focus, wherein the workpiece can be disposed substantially in said second focus region of said second tip region.

11. The device of claim 1, wherein said first tip region and said non-divergent region are disposed at an angle with respect to one another, and further comprising a reflecting surface disposed between said first tip region and said non-divergent region.

12. The device of claim 1, wherein at least two first tip regions, each comprising one microwave antenna, are disposed parallel to one another to merge into a common non-divergent region.

13. The device of claim 12, wherein said at least two first tip regions are disposed next to one another.

14. The device of claim 12, wherein two microwave sources are disposed diagonally opposite to one another relative to a second treatment focus.

15. The device of claim 1, wherein several microwave antennas are disposed at least on one side of the workpiece, parallel to one another in first tip regions associated therewith.

16. The device of claim 1, wherein several microwave antennas are symmetrically distributed in associated first tip regions about a treatment focus.

17. The device of claim 1, wherein a plasma treatment region is delimited from a microwave producing region by a separating body disposed in said housing, at a separation from said first focus region.

18. The device of claim 17, wherein said separating body is substantially a flat wall.

19. The device of claim 17, wherein said separating body is a semi-cylindrical coating disposed above a treatment focus and tightly connected to a wall of said housing.

20. The device of claim 17, wherein said separating body is formed by a dielectric pipe surrounding a treatment focusing region.

21. The device of claim 1, further comprising winding mandrels disposed within said housing for plasma formation on a sheet-shaped workpiece, wherein at least one deflecting or guiding means is provided in a vicinity of a treatment focus.

22. The device of claim 1, further comprising a mixer disposed in a treatment region for microwave treatment of bulk material.

23. The device of claim 1, further comprising a worm conveyor in a region of a treatment focus for supplying a material to be treated.

24. The device of claim 1, further comprising a gas guiding pipe communicating with a pump and extending along a treatment focus.

* * * * *